(12) United States Patent
Suzuki et al.

(10) Patent No.: US 7,906,823 B2
(45) Date of Patent: Mar. 15, 2011

(54) MEMS APPARATUS AND METHOD OF MANUFACTURING THE SAME

(75) Inventors: Kazuhiro Suzuki, Tokyo (JP);
Michihiko Nishigaki, Kanagawa (JP);
Yutaka Onozuka, Kanagawa (JP);
Hiroshi Yamada, Kanagawa (JP);
Kazuhiko Itaya, Kanagawa (JP);
Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 12/195,587

(22) Filed: Aug. 21, 2008

(65) Prior Publication Data
US 2009/0050988 A1 Feb. 26, 2009

(30) Foreign Application Priority Data

Aug. 21, 2007 (JP) ................. 2007-215141

(51) Int. Cl.
*H01L 29/84* (2006.01)
(52) U.S. Cl. ............... 257/417; 257/418; 257/E29.324; 438/51; 438/52

(58) Field of Classification Search .......... 257/417, 257/418, E29.324; 438/51, 52
See application file for complete search history.

(56) References Cited

U.S. PATENT DOCUMENTS

| 7,344,907 B2 * | 3/2008 | Colgan et al. | 438/51 |
| 2006/0108675 A1 * | 5/2006 | Colgan et al. | 257/684 |
| 2007/0099395 A1 * | 5/2007 | Sridhar et al. | 438/460 |
| 2008/0296717 A1 * | 12/2008 | Beroz et al. | 257/434 |
| 2009/0289349 A1 * | 11/2009 | Novotny et al. | 257/698 |

FOREIGN PATENT DOCUMENTS

| JP | 10-163505 | 6/1998 |
| JP | 2004-042248 | 2/2004 |

OTHER PUBLICATIONS

Decharat, et al., Novel Room-Temperature Wafer-to-Wafer Attachment and Sealing of Cavities Using Cold Metal Welding, MEMS, 2007.

\* cited by examiner

*Primary Examiner* — Ngan Ngo
(74) *Attorney, Agent, or Firm* — Turocy & Watson, LLP

(57) ABSTRACT

A MEMS apparatus includes a MEMS unit formed on a semiconductor substrate and a cover provided with a pore and serving to seal the MEMS unit. The pore is sealed with a sealing material shaped in a sphere or a hemisphere.

9 Claims, 14 Drawing Sheets

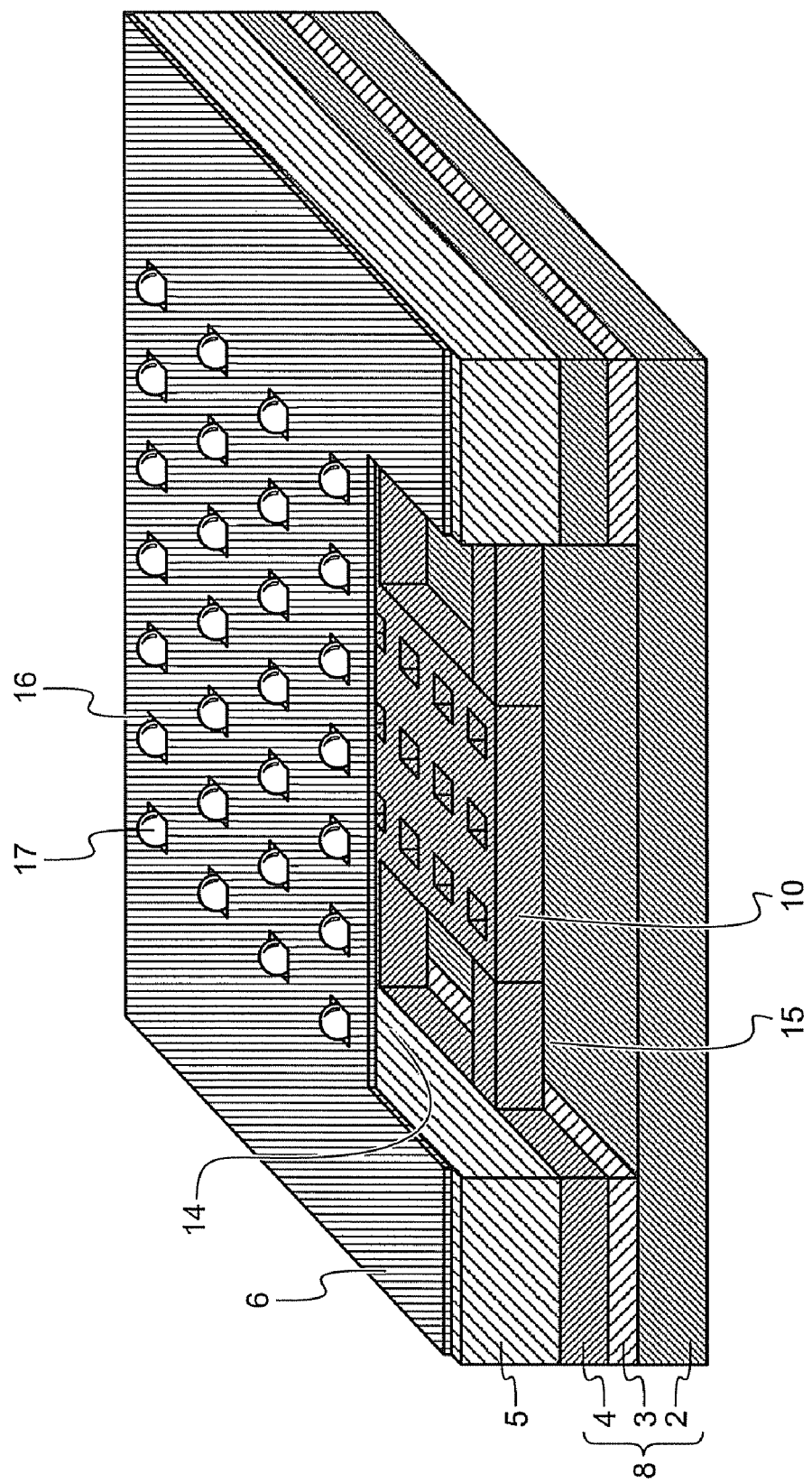

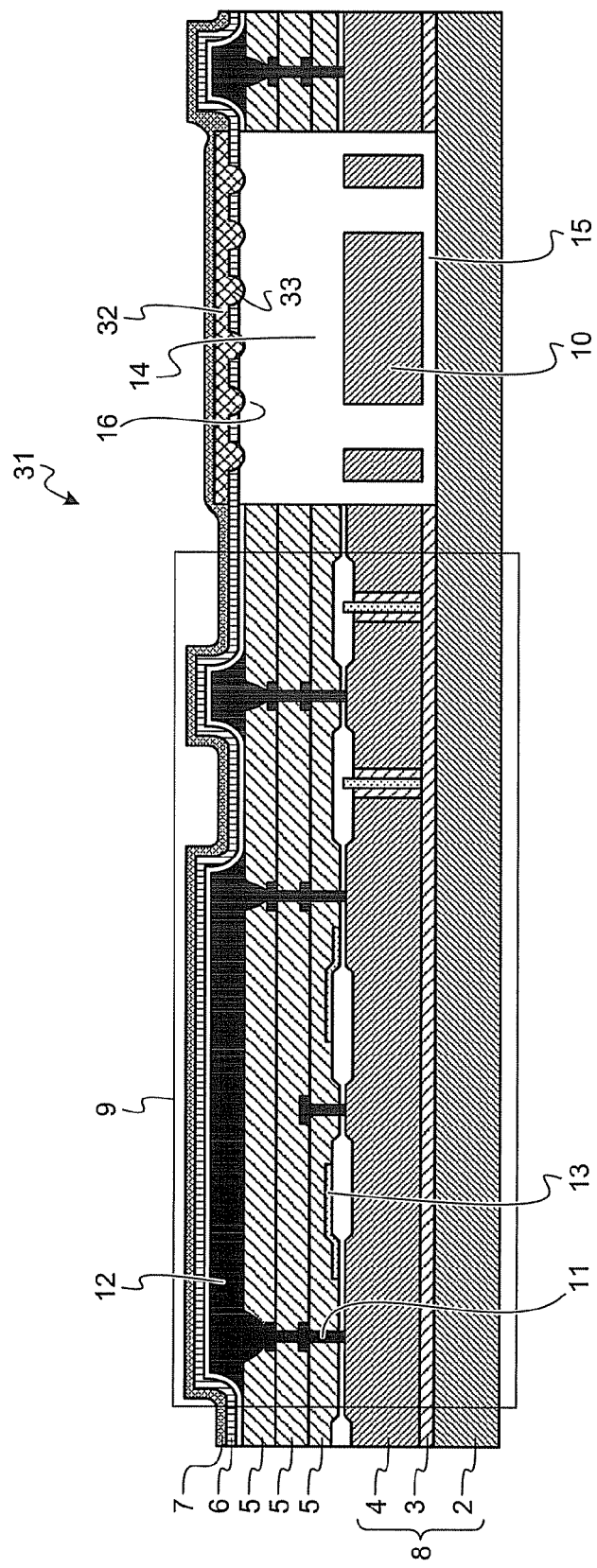

ACTUAL ALIGNMENT

DEFECTIVE SPOT

MONITOR SIGNAL

DEFECTIVE SPOT

MEMS APPARATUS AND METHOD OF MANUFACTURING THE SAME

CROSS-REFERENCE TO RELATED APPLICATIONS

This application is based upon and claims the benefit of priority from the prior Japanese Patent Application No. 2007-215141, filed on Aug. 21, 2007; the entire contents of which are incorporated herein by reference.

BACKGROUND OF THE INVENTION

1. Field of the Invention

The present invention relates to a MEMS apparatus that includes a substrate mounted thereon a microelectromechanical system (MEMS) that has a sensor or an actuator (mechanical drive mechanism), and an integrated circuit that drives the mechanical drive mechanism, and a method of manufacturing the MEMS apparatus.

2. Description of the Related Art

Higher functions and higher performance can easily be realized with MEMS apparatuses created using semiconductor manufacturing technologies. Today, sensors and actuators applied with various MEMS apparatuses are commercially produced, and functional systems are being offered. In view of stability of the functional systems and improvement of the MEMS apparatuses on mechanical characteristics, a highly hermetic packaging technology or a sealing technology that protects the MEMS apparatus from an external factor such as moisture, while maintaining a hollow structure of the MEMS apparatus, has become important.

A general method of hermetically sealing a semiconductor substrate is an anodic bonding. The anodic bonding is a method that overlaps a glass that includes mobile ions and a silicon wafer (or metal and the like), and then softens the glass side by heating the overlapped glass and silicon wafer. At the same time, an electric double layer is generated by applying a high negative voltage to the glass side and a high positive voltage to the silicon wafer side, thereby joining the glass and the silicon wafer by electrostatic attractive force.

For example, in JP-A H10-163505 (KOKAI), a semiconductor inertial sensor suitable for, for example, a capacitance type acceleration sensor and an angular velocity sensor, is disclosed. The semiconductor inertial sensor is made by joining a silicon wafer formed with movable electrodes (MEMS) and a glass substrate formed with concaves using the anodic bonding. In JP-A 2004-42248 (KOKAI), an optical scanner (MEMS structure) formed by carrying out the anodic bonding between a dielectric body and a glass substrate, and the anodic bonding between the dielectric body and a metal film is disclosed. Moreover, in Adit Decharat et al., Novel Room-Temperature Wafer-to-Wafer Attachment and Sealing of Cavities Using Cold Metal Welding, MEMS2007, pp. 411-414, a method of capping by providing concaves and convexes to a substrate mounted with the MEMS and to a cap material that protects the MEMS in advance, and fitting the respective concaves and the convexes is disclosed.

However, in general, in the anodic bonding, the glass and the silicon wafer should be heated up to approximately 500 degrees centigrade, and a voltage of approximately 1000 volts should be applied between the glass and the silicon wafer. The environment of such a high temperature and a high voltage does not cause a significant problem to the structure of the single crystal silicon, but when a controlling circuit is mounted thereon, it will lead to a destruction of a transistor. In other words, with the device formed by the anodic bonding, it is difficult to form mechanical MEMS components and a circuit to control thereof on the same substrate. Accordingly, the MEMS and the controlling IC have no choice but to be formed on separate semiconductors. Subsequently, an occupying area of the entire chip and the manufacturing cost are increased.

Moreover, the glass and the silicon wafer that have close thermal expansion coefficients need to be used. Therefore, a special glass is required in the anodic bonding, thereby causing problems of narrowing the choice of cap materials, and increasing the material costs.

With the capping method in Adit Decharat et al., Novel Room-Temperature Wafer-to-Wafer Attachment and Sealing of Cavities Using Cold Metal Welding, MEMS2007, pp. 411-414, because the concaves and the convexes are provided to the substrate and the cap material, and the respective concaves and convexes are fitted in, a load to the device is smaller compared with the anodic bonding. However, to correctly fit the respective concaves and convexes, the high alignment accuracy is required. Even if a small deviation occurs while fitting the substrate and the cap material, the concaves and the convexes will not fit properly, and may be joined diagonally leaving a space. Therefore, it is difficult to seal with high hermeticity.

SUMMARY OF THE INVENTION

According to one aspect of the present invention, a MEMS apparatus includes a MEMS unit formed on a semiconductor substrate; and a cover provided with a pore and serving to seal the MEMS unit, wherein the pore is sealed with a sealing material shaped in a sphere or a hemisphere.

According to another aspect of the present invention, a MEMS apparatus includes a MEMS unit formed on a semiconductor substrate; and a cover provided with a pore and serving to seal the MEMS unit, wherein the pore is sealed with a sealing material that is a substrate having a sphere or a hemisphere shaped portion on a surface of the substrate.

According to still another aspect of the present invention, a method of manufacturing a MEMS apparatus, in a semiconductor substrate having a MEMS unit formed thereon, with an upper part of the MEMS unit being covered by a film with a pore, and a hollow portion being formed between the MEMS unit and the film, the method includes filling a sealing material shaped in a sphere or a hemisphere in the pore; and depositing a coat that covers the film and the sealing material.

According to still another aspect of the present invention, a method of manufacturing a MEMS apparatus, in a semiconductor substrate having a MEMS unit formed thereon, with an upper part of the MEMS unit being covered by a film with a pore, and a hollow portion being formed between the MEMS unit and the film, the method includes filling in the pore a sphere or a hemisphere shaped portion formed on a surface of a sealing material that is a substrate; and depositing a coat that covers the film and the sealing material.

BRIEF DESCRIPTION OF THE DRAWINGS

FIG. 2 is a perspective sectional view of a MEMS unit before a coat is deposited, viewed from an upper oblique angle;

FIG. 8 is a sectional view of a MEMS apparatus according to a second embodiment;

FIG. 9 is an explanatory diagram of a sealing substrate viewed from the opposite side of a surface placed on the cover;

DETAILED DESCRIPTION OF THE INVENTION

Exemplary embodiments of a MEMS apparatus and a method of manufacturing the MEMS apparatus according to the present invention will now be explained in detail below with reference to the accompanying drawings. Note that the drawings are schematic, and a relationship between the thickness and the plan dimension, and ratios of the thicknesses of respective layers, for example, may be different from those of the actual ones. Accordingly, specific thicknesses and dimensions must be judged in consideration of the following explanations. It is also apparent that portions with different relative sizes or ratios may be included between the respective drawings.

Figure 1:
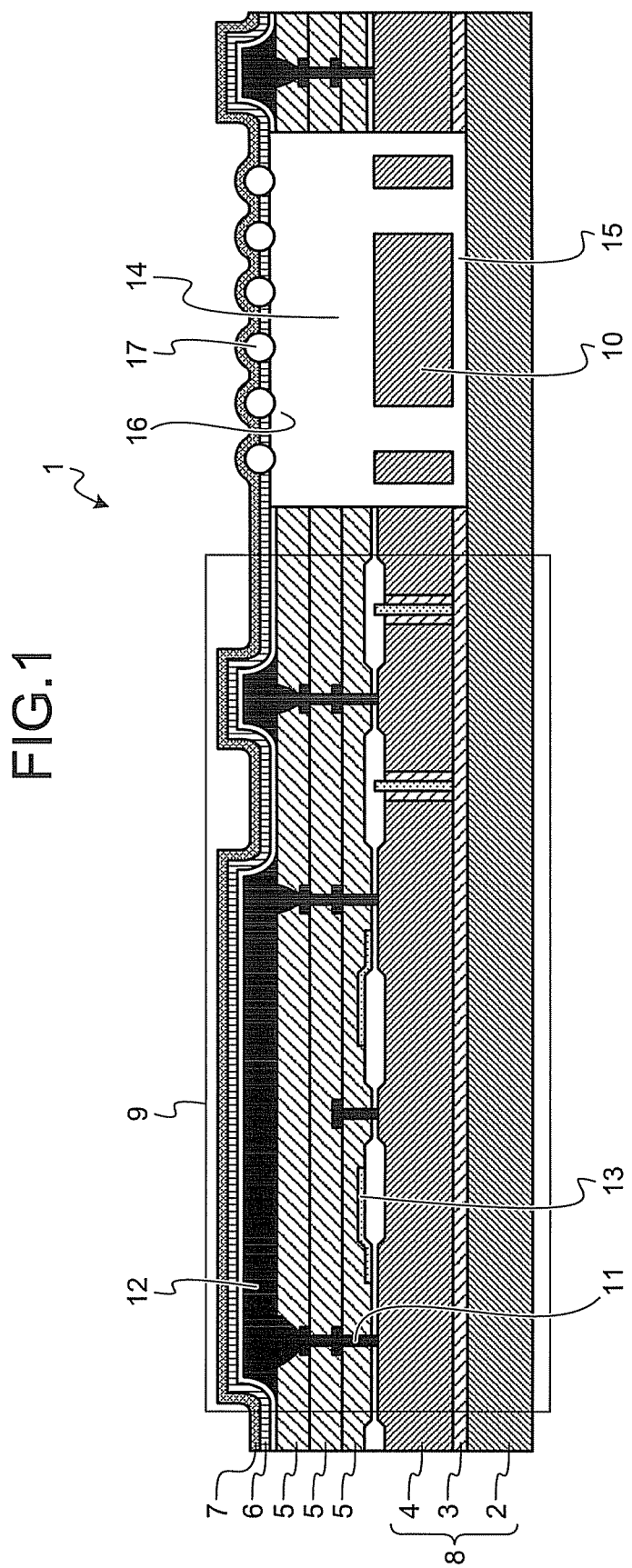
FIG. 1 is a sectional view of a MEMS apparatus according to a first embodiment.

As shown in FIG. 1, a microelectromechanical system (MEMS) apparatus 1 mainly includes a buried oxide film (BOX) layer 3, a single crystal semiconductor layer 4, a plurality of interlayer insulating films 5, a cover 6, and a coat 7 sequentially on a substrate 2.

A semiconductor substrate, more specifically, a single crystal silicon substrate is used for the substrate 2. The buried oxide film (BOX) layer 3 is an insulating material that isolates the substrate 2 from the single crystal semiconductor layer 4, and a silicon dioxide is generally used therefor. A single crystal silicon layer is practically used for the single crystal semiconductor layer 4. In other words, a silicon-on-insulator (SOI) substrate 8 of which the single crystal semiconductor layer 4 is deposited on the substrate 2 interposing therebetween the buried oxide film (BOX) layer 3, which is an insulating layer, is used.

The MEMS apparatus 1 can be functionally divided into a control circuit unit 9 and a MEMS unit 10. The control circuit unit 9 is a circuit that controls the MEMS unit 10, and includes the SOI substrate 8, the interlayer insulating films 5, an electrode 11 and a thin film wiring 12 made of aluminum, a polysilicon 13, and the like. The control circuit unit 9 forms a circuit made of a semiconductor element transistor.

The MEMS unit 10 is a portion that mechanically drives a sensor, an actuator, or the like, and formed mainly by the single crystal semiconductor layer 4 of the SOI substrate 8. As shown in FIG. 1, a cavity 14, which is a hollow portion, is formed at the upper part of the MEMS unit 10, by etching (removing) the interlayer insulating films 5 that were present originally. A cavity 15 is formed at the lower part of the MEMS unit 10, by etching (removing) the buried oxide film (BOX) layer 3 that was present originally. The control circuit unit 9 and the MEMS unit 10 are connected via a portion, which is not shown, of the single crystal semiconductor layer 4.

As shown in FIGS. 1 and 2, the cover 6 is provided on an upper surface of the control circuit unit 9 and the cavity 14, and protects the control circuit unit 9 and the cavity 14. A polysilicon, a metal thin film such as aluminum, titanium (Ti), or copper (Cu), a silicon oxide such as silicon dioxide ($SiO_2$) and silicon nitride (SiN), a photoresist, or the other organic materials may be used as a material for the cover 6.

A plurality of pores 16 are formed on the cover 6 in a lattice pattern. The pores 16 are used as etching holes to etch the interlayer insulating films 5 present at the upper part of the MEMS unit 10.

A sealing material 17 is filled into the pores 16. The cover 6 filled in with the sealing material 17 hermetically seals the MEMS unit 10 (cavity 14) from the outside. The sealing material 17 is an element or a particle shaped in a sphere or a hemisphere having a size larger than the pore 16 that can completely cover the pore 16. The one formed of a self-assembled film, an organic body, a conductor such as metal, a fluorescent emitter, a magnetic body, or the like, may be used as a material for the sealing material 17.

Figure 3A:
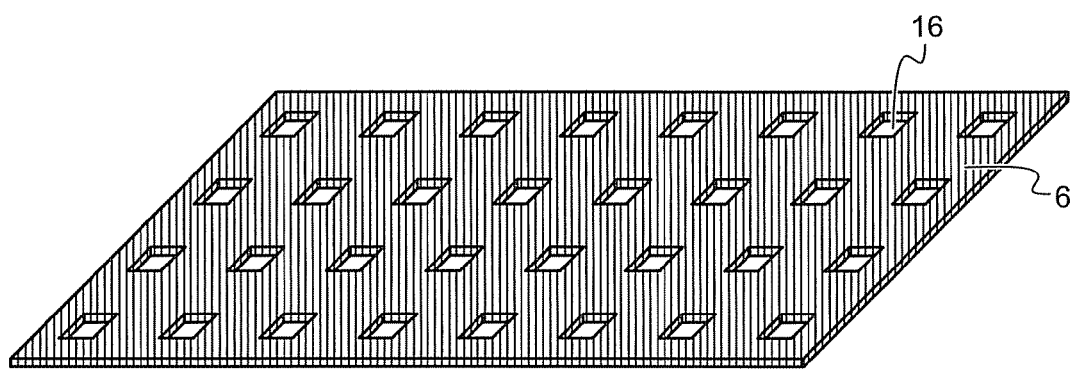
FIGS. 3A and 3B are explanatory diagrams of a cover shown in FIG. 1.
Figure 3B:
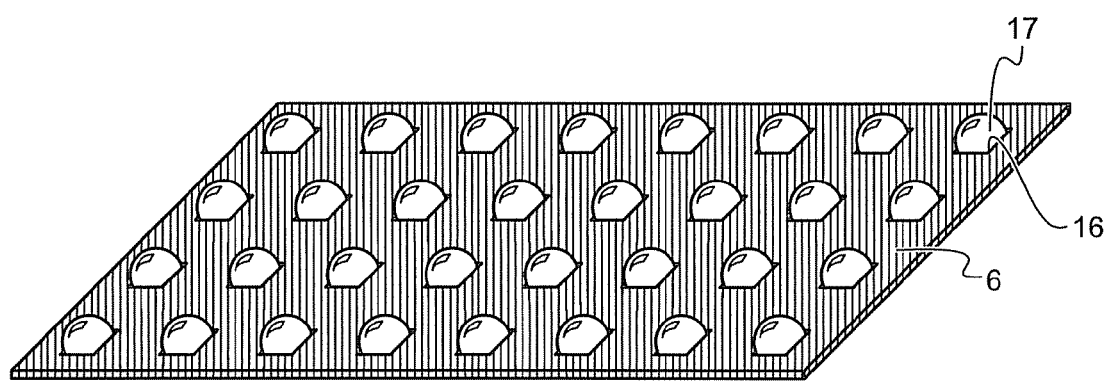
Figure 4A:
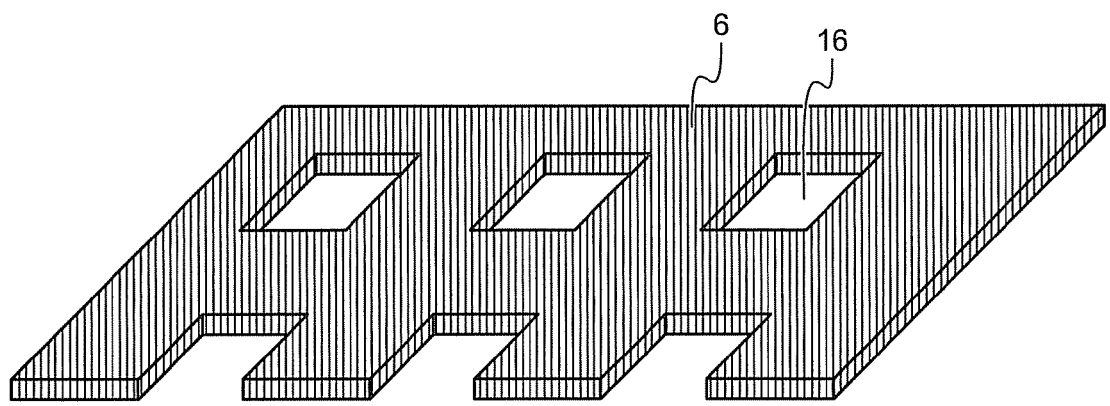
FIGS. 4A and 4B are sectional views of the cover shown in FIG. 1.
Figure 4B:
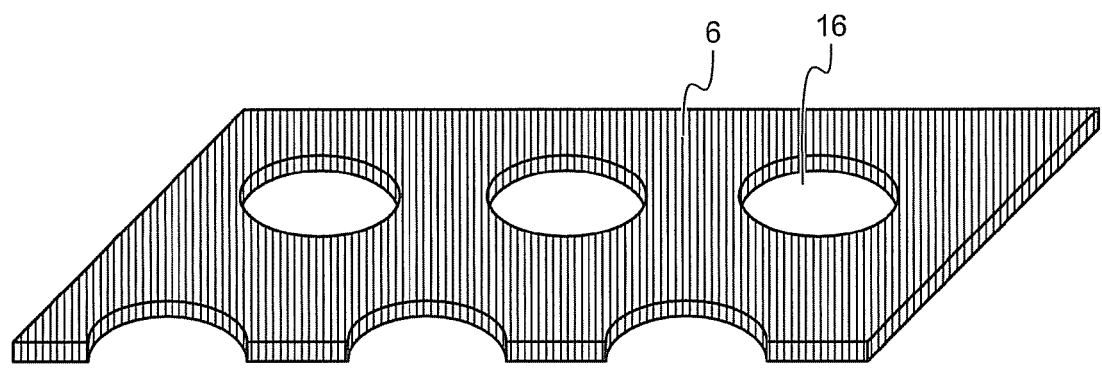

FIG. 3A depicts the cover 6 before the sealing material 17 is filled into the pores 16, and FIG. 3B depicts the cover 6 after the sealing material 17 is filled into the pores 16. As shown in FIG. 3B, the sealing material 17 is filled into all the pores 16. The cover 6 shown in FIGS. 3A and 3B is only a part where the pores 16 are formed of the entire cover. In FIGS. 3A and 3B, the pores 16 are formed in a lattice pattern with respect to the cover 6. However, the pores 16 may be formed in a line with respect to the cover 6. Although the shape of the pores 16 is rectangular, the shape may also be circular or oval. Whatever the shape is, the sealing material 17 may be filled into the pores 16. FIG. 4A depicts the cover 6 that has rectangular pores 16. FIG. 4B depicts the cover 6 that has circular (oval) pores 16. The cover 6 shown in FIGS. 4A and 4B is only a part where the pores 16 are formed of the entire cover. With the pores 16 in FIGS. 4A and 4B, the pore diameter at the upper surface and the pore diameter at the lower surface are the same in size. However, the pores may be in a tapered shape or in an inverse tapered shape with respect to the upper surface.

If there is no need to protect the control circuit unit 9, but only needs to hermetically seal and protect the MEMS unit 10, the cover 6 may only be provided on the upper surface of the MEMS unit 10 (cavity 14).

Referring back to FIG. 1, the coat 7 is deposited on the upper surface of the cover 6 (sealing material 17), and adheres (joins) the cover 6 and the sealing material 17. A polysilicon, the metal thin film such as aluminum, Ti, or Cu, the silicon oxide such as $SiO_2$ and SiN, the photoresist, or the other organic materials may be used as a material for the coat 7. The coat 7 may not be provided on the entire cover 6, but may be provided only on a portion where the sealing material 17 is filled of the cover 6.

Figure 5:
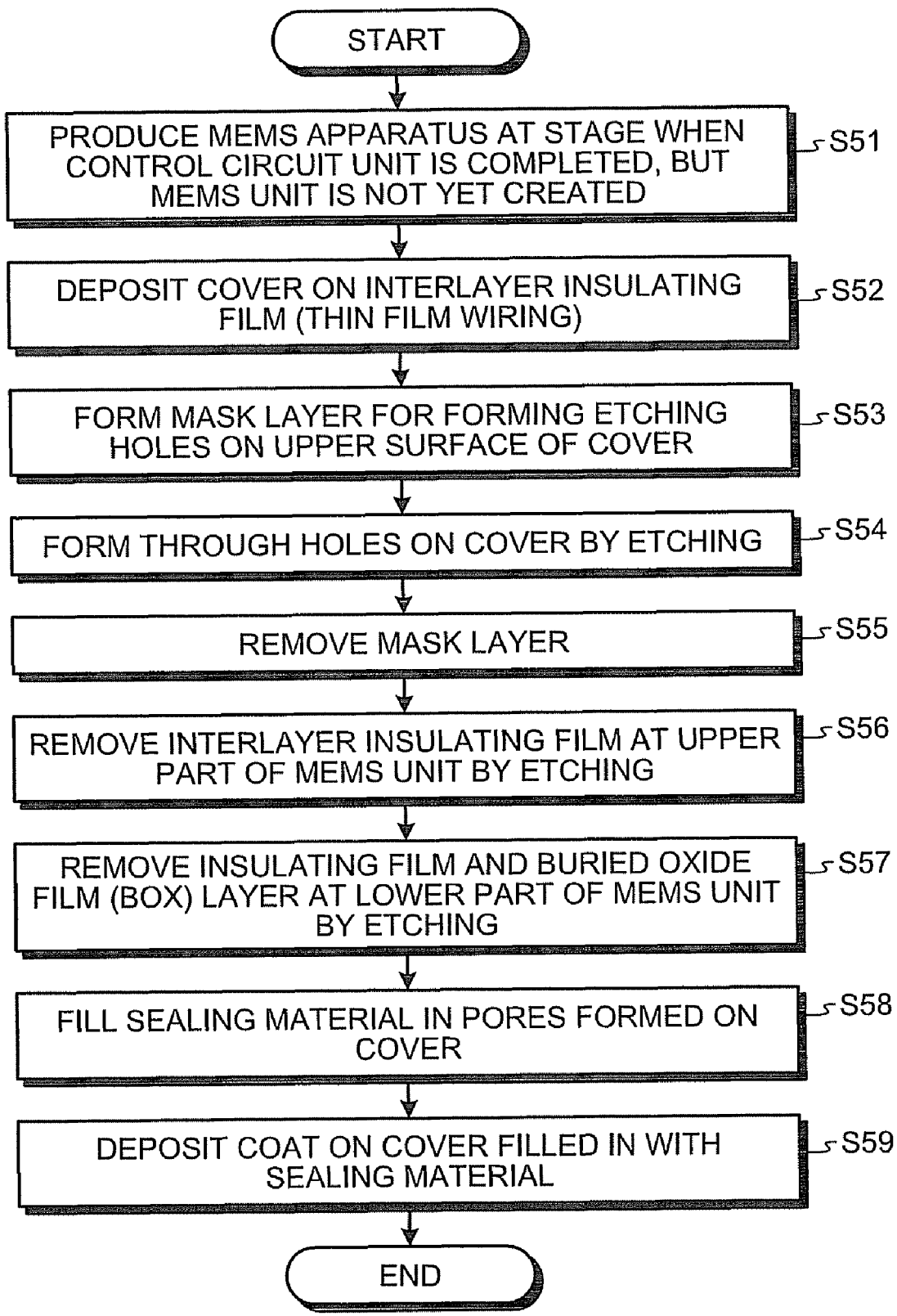
FIG. 5 is a flowchart showing a method of manufacturing the MEMS apparatus according to the first embodiment.

A method of manufacturing the MEMS apparatus according to a present embodiment will now be explained with reference to FIG. 5. In FIGS. 6A to 6I, the MEMS unit 10 is formed in the center of the diagrams, and the control circuit unit 9 is formed from the both ends of the diagrams to a portion that is not shown.

Figure 6A:
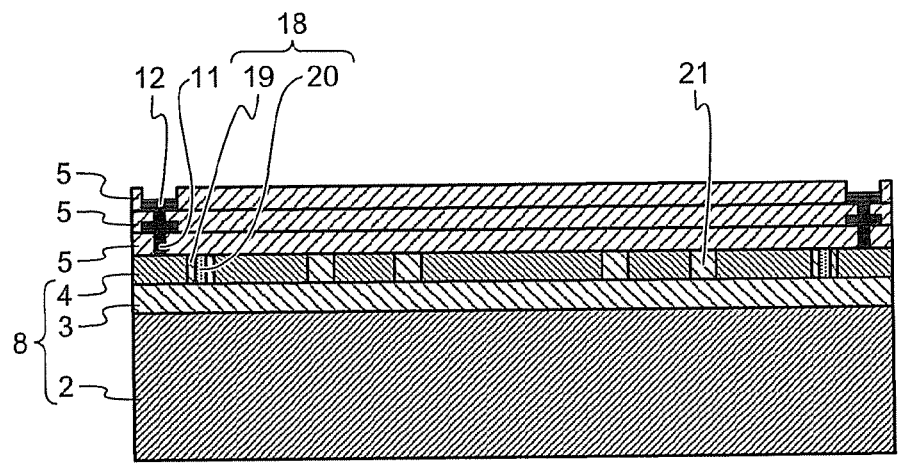
FIG. 6A is a process sectional view of the MEMS apparatus at a stage when a control circuit unit is completed but the MEMS unit is not yet created.

First, as shown in FIG. 6A, the MEMS apparatus 1 at a stage when the control circuit unit 9 is completed but the MEMS unit 10 is not yet created will be produced (step S51).

The method of manufacturing the MEMS apparatus 1 up to this stage is as follows: First, prepare the SOI substrate 8. The SOI substrate 8, for example, may be manufactured by the following methods.

(1) Form the buried oxide film (BOX) layer 3 on the substrate 2, and then form the single crystal semiconductor layer 4 on the buried oxide film (BOX) layer 3.

(2) Form the buried oxide film (BOX) layer 3 by injecting an impurity in a bulk of the substrate 2. A portion on the buried oxide film (BOX) layer 3 of the substrate is used as the single crystal semiconductor layer 4.

(3) Form the buried oxide film (BOX) layer 3 on the substrate 2, and attach the single crystal semiconductor layer 4 on the surface of the buried oxide film (BOX) layer 3.

Then, a cavity for dielectric isolation is formed in the SOI substrate 8. This cavity is formed by dry etching from the surface of the SOI substrate 8 so as to reach the buried oxide film (BOX) layer 3.

Then, a dielectric isolation region 18 is formed in the SOI substrate 8. An isolating insulator 19 is formed along a bottom surface and a side wall of the cavity for the dielectric isolation formed in the SOI substrate 8. Then, complete the dielectric isolation region 18, by forming an embedding body 20 in an isolating trench interposing therebetween the isolating insulator 19.

The semiconductor element transistor is now formed in a semiconductor active region of the single crystal semiconductor layer 4. The semiconductor element transistor will be formed as follows. First, a gate insulating film (not shown) is formed on a surface of the semiconductor active region. A control electrode 11 is then formed on the gate insulating film. Subsequently, to the both sides of the control electrode 11, a pair of main electrodes 11 is formed at a surface portion of the semiconductor active region.

Then, the interlayer insulating film 5 is formed on the semiconductor element transistor. In the semiconductor active region of the single crystal semiconductor layer 4 of the MEMS unit 10, a second trench for forming the MEMS unit 10 is formed by the dry etching and the like. At this time, the buried oxide film (BOX) layer 3 present at the lower part of the semiconductor active layer functions as an etching stop layer.

An insulating film 21 for protecting the side wall is then deposited in the formed second trench. For example, the insulating film 21 adapts an oxide film and the like.

By connecting to the pair of main electrodes 11 through a connecting hole, the thin film wiring 12 connected to the semiconductor region of the single crystal semiconductor layer 4 is formed on the interlayer insulating film 5. The thin film wiring 12, for example, is formed by patterning an aluminum alloy film formed by sputtering, by using a photolithography technique and an etching technique. A second interlayer insulating film 5 is then deposited on the entire surface of the device. If needed, a second thin film wiring 12 can be formed at the boundary surface via the second interlayer insulating film 5. Further, if needed, a third interlayer insulating film 5 may be deposited and a third thin film wiring 12 may be formed thereon. In FIG. 6A, the third thin film wiring 12 is not shown. Eventually, the control circuit unit 9 is completed through these processes.

Figure 6B:
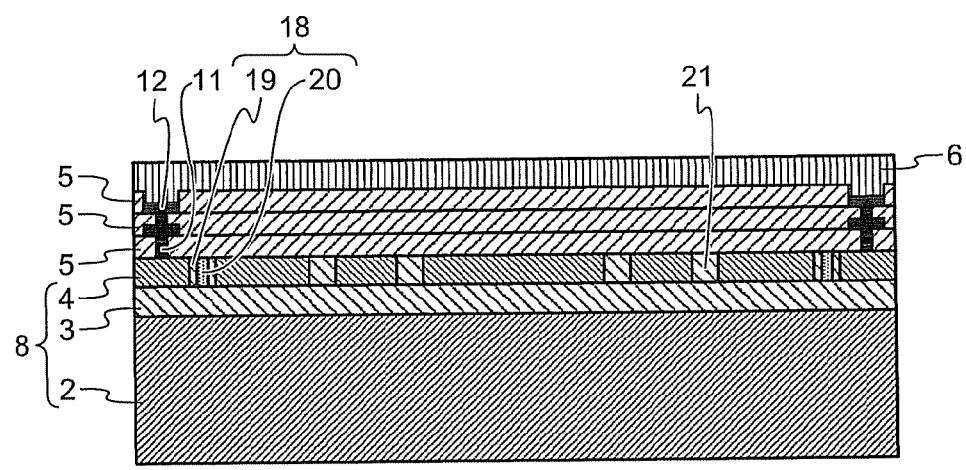
FIG. 6B is a process sectional view of the MEMS apparatus after the cover is deposited.

After the control circuit unit 9 is completed, as shown in FIG. 6B, the cover 6 is deposited on the third interlayer insulating film 5 (third thin film wiring 12) (step S52). In the present embodiment, a conductive material such as aluminum or Cu is used for the cover 6.

Figure 6C:
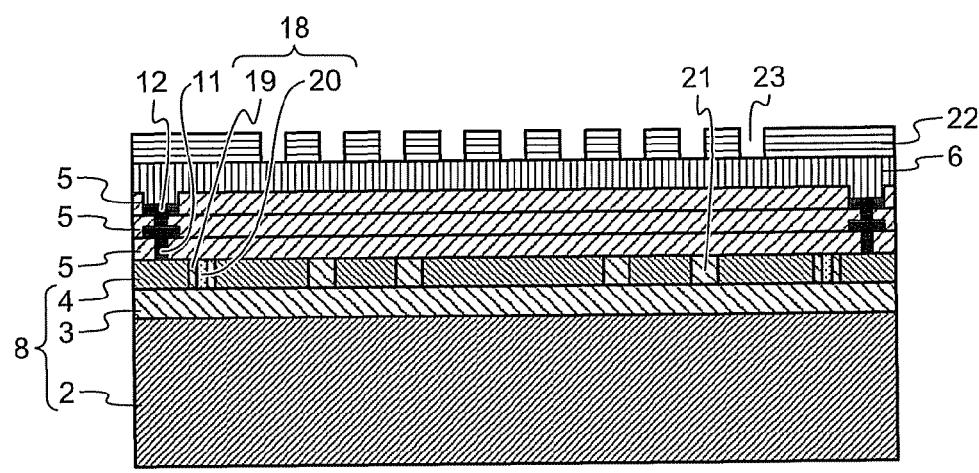
FIG. 6C is a process sectional view of the MEMS apparatus after a mask layer is formed.

As shown in FIG. 6C, a mask layer 22 is then formed to form the etching holes (pores 16) on the upper surface of the cover 6, to remove the interlayer insulating film 5 present at the upper part of the MEMS unit 10 (step S53). The photoresist is used for the mask layer 22, and by coating, exposing, and developing the photoresist, the mask layer 22 that includes resist windows 23 having the same size as the etching holes (pores 16) in a lattice pattern will be formed.

Figure 6D:
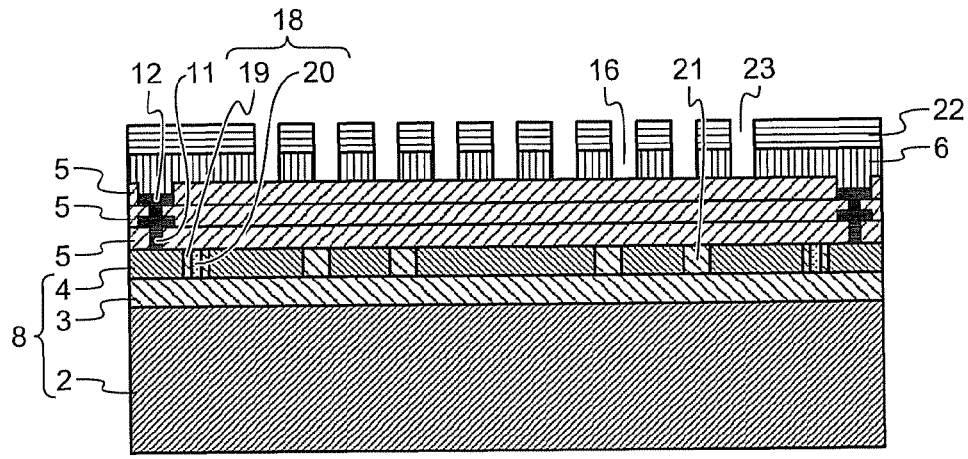
FIG. 6D is a process sectional view of the MEMS apparatus after etching holes (pores) are formed.

Then, as shown in FIG. 6D, through holes as the etching holes (pores 16) are formed on the cover 6, by isotropic etching or anisotropic etching (step S54). In the present embodiment, liquid or gas that can selectively etch the cover 6 is used. The shape and the size of the etching holes (pores 16) may be of any design, depending on a type of the sphere or the hemisphere used in a sealing process of the pores 16, which will be carried out later. In the present embodiment, the etching holes (pores 16) are round pores of approximately 1 micrometer diameter.

Figure 6E:
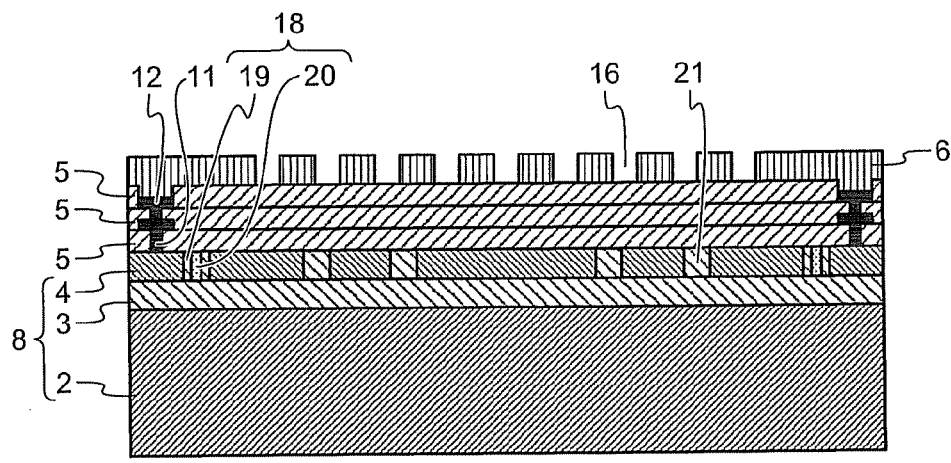
FIG. 6E is a process sectional view of the MEMS apparatus after the mask layer is removed.

As shown in FIG. 6E, the mask layer 22 is removed therefrom (step S55).

Figure 6F:
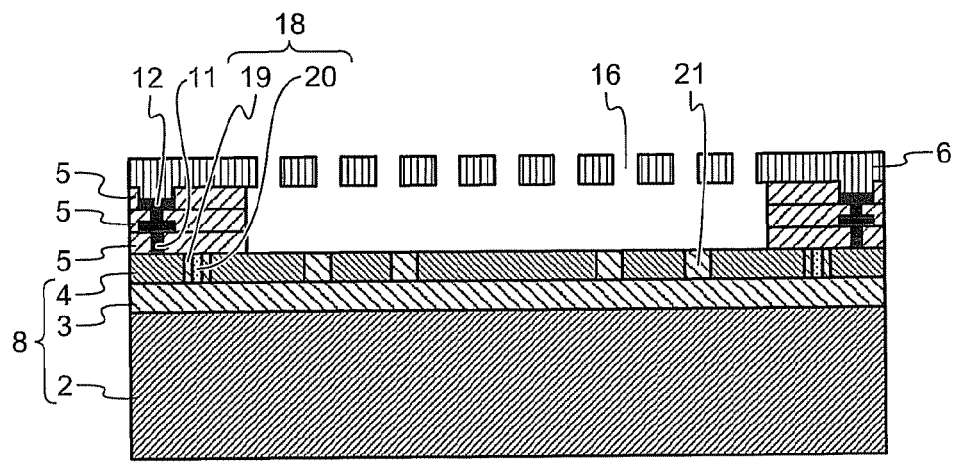
FIG. 6F is a process sectional view of the MEMS apparatus after an interlayer insulating film present at an upper part of the MEMS unit is removed.

As shown in FIG. 6F, by using the pores 16 formed on the cover 6 as the etching holes, the interlayer insulating films 5 present at the upper part of the MEMS unit 10 are removed by selective etching (step S56). Wet etching using an etchant based on hydrofluoric acid (HF), or the dry etching such as vapor etching and chemical dry etching (CDE) is used.

Figure 6G:
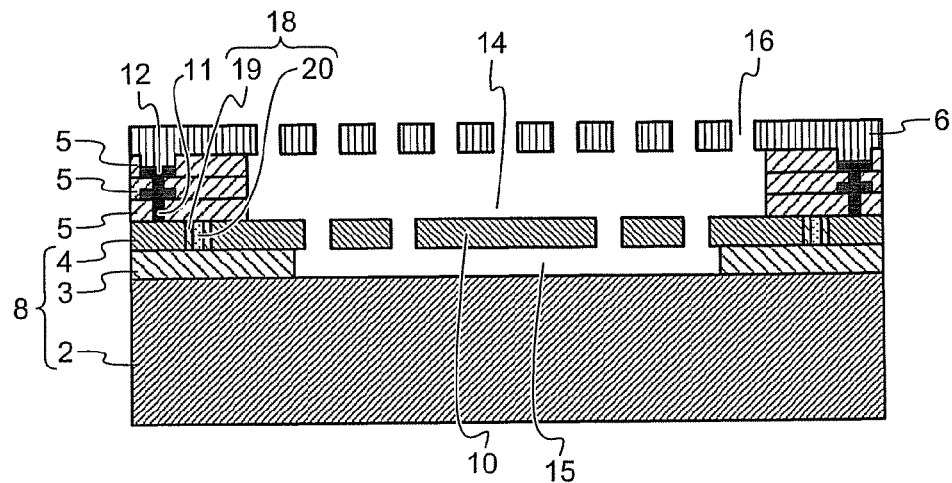
FIG. 6G is a process sectional view of the MEMS apparatus after an insulating film and a buried oxide film (BOX) layer present at a lower part of the MEMS unit are removed.

Then, as shown in FIG. 6G, by using the pores 16 formed on the cover 6 as the etching holes, the insulating film 21 and the buried oxide film (BOX) layer 3 present at the lower part of the MEMS unit 10 are removed by the selective etching (step S57). The wet etching using the etchant based on hydrofluoric acid (HF), or the dry etching such as the vapor etching or the chemical dry etching (CDE) is used. When the process is finished, the MEMS unit 10 (cavities 14 and 15) isolated from the surroundings is completed. Accordingly, it is possible to form a sensor element that mechanically operates with respect to the external physical quantity, and an actuator that operates three-dimensionally by the external application.

Figure 6H:
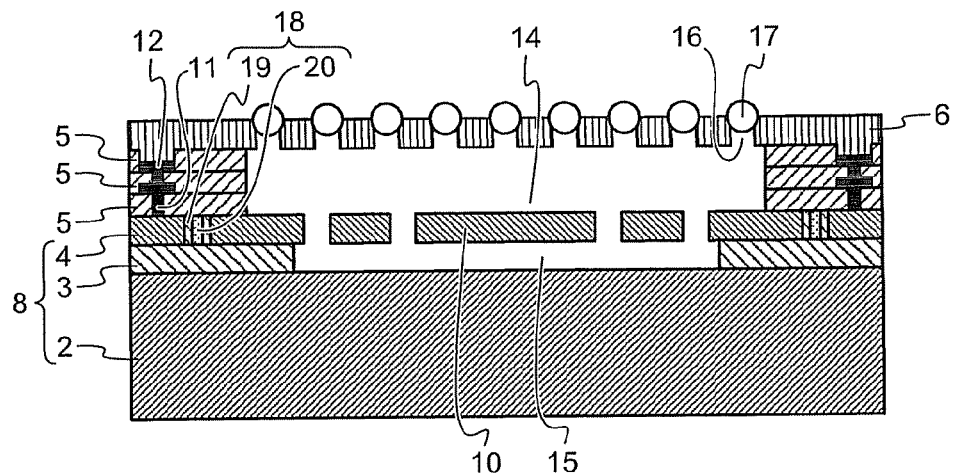
FIG. 6H is a process sectional view of the MEMS apparatus after a sealing material is filled into the pores formed on the cover.

As shown in FIG. 6H, the sealing material 17 made in advance is filled into the pores 16 formed on the cover 6 in a simplified manner (step S58). The physical energy of the pores 16 formed on the cover 6 is low, with respect to the region of the cover 6 where the pores 16 are not formed thereon. The sealing material 17 in a sphere or a hemisphere, that has its own potential, fits into the pores 16 to stabilize, due to the unstable shape. To urge the movement of the sphere or the hemisphere, physical vibration can also be applied from outside.

In the present embodiment, electrostatic force is used as a method to fill the sealing material 17 into the pores 16 formed on the cover 6. Accordingly, polyphenylene sulfide (PPS) is used as a material for the sealing material 17. Because the PPS is an electret material, it is possible to charge in advance. By carrying out corona discharge to the sealing material 17 made of PPS, the sealing material 17 with any electric charge can be obtained. The particle diameter of the sealing material 17 shaped in a sphere or a hemisphere is approximately 1.1 micrometers, which is larger than the diameter of the pores 16, because the diameter of the pores 16 formed on the cover 6 is approximately 1 micrometer.

A bias is applied from outside to the cover 6 made of conductive material. For example, if the pores 16 are charged with a positive charge, and the sealing material 17 is charged with a negative charge, the electric charges of the pores 16 and the sealing material 17 have different polarities. Accordingly, the sealing material 17 is electrostatically induced and filled into the pores 16.

Figure 6I:
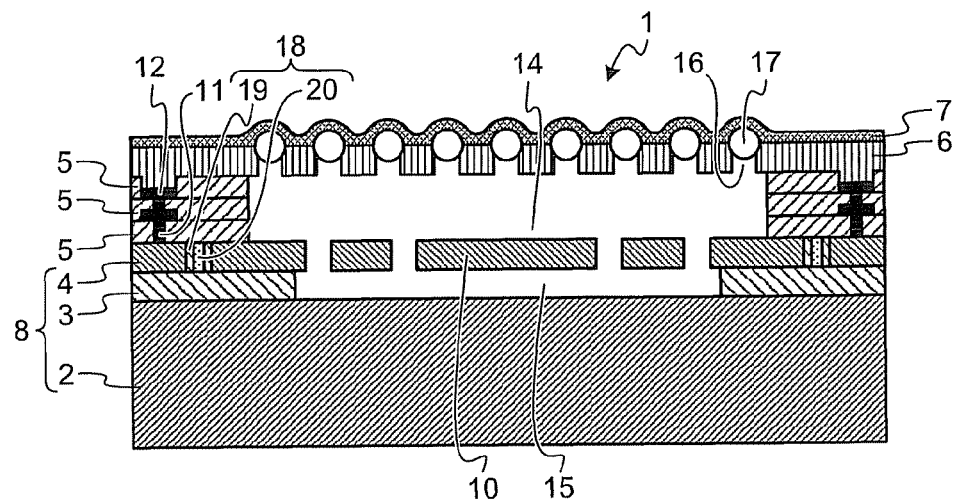
FIG. 6I is a process sectional view of the MEMS apparatus after the coat is deposited on the cover filled in with the sealing material.

Finally, as shown in FIG. 6I, the coat 7 is deposited on the cover 6 filled in with the sealing material 17, by a chemical vapor deposition (CVD) and the sputtering, and adheres (joins) the cover 6 and the sealing material 17 (step S59). With the present process, the sealing material 17 is fixed into the pores 16, and even if there is a minute gap between the pore 16 and the sealing material 17, the gap will be filled in. The MEMS apparatus 1 is completed through the processes from the steps S51 to S59. If needed, an opening for an input/output (I/O) pad (not shown) may be opened at any position, on the surface of the substrate 2 where the MEMS apparatus 1 is formed.

Figure 7:
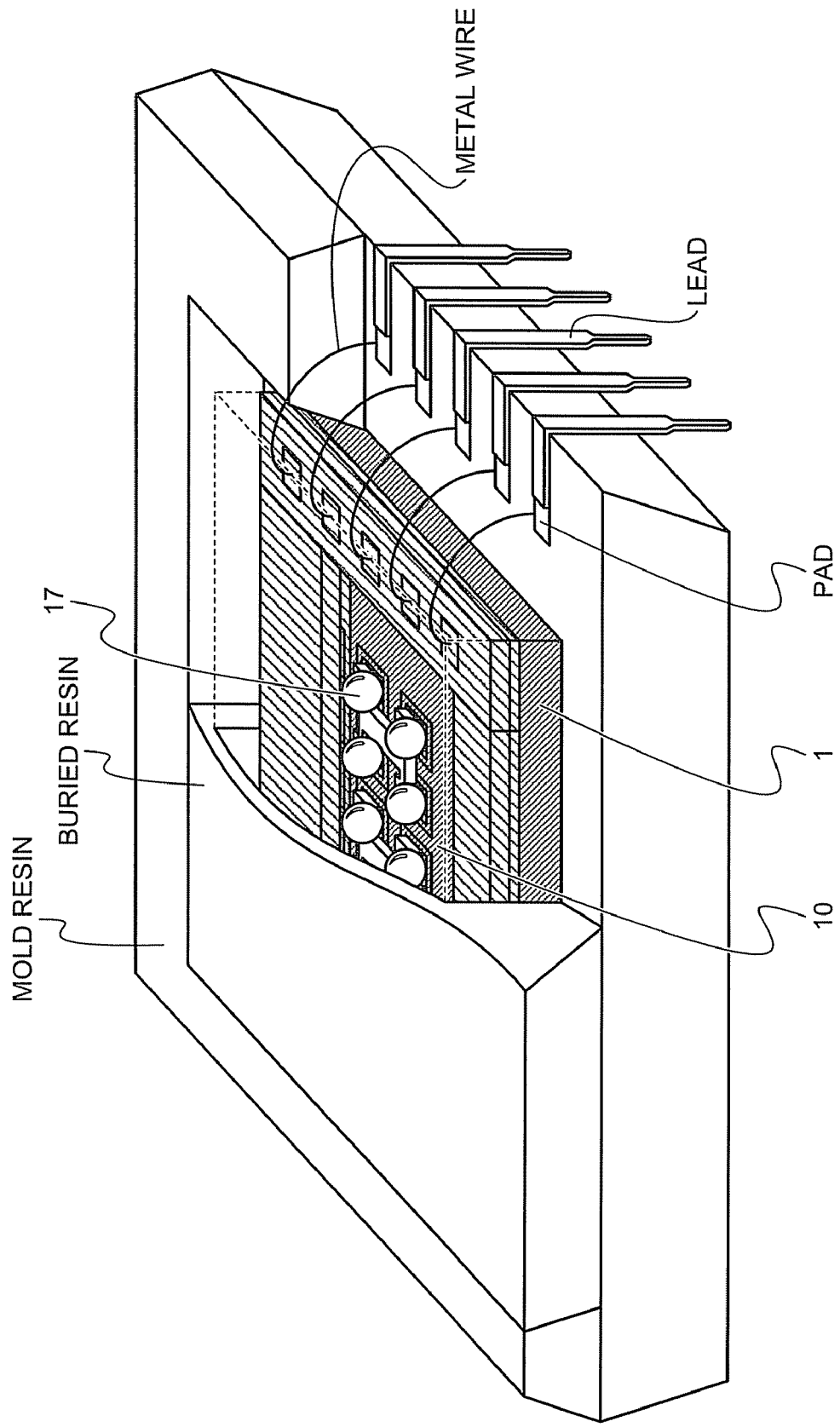
FIG. 7 is a schematic view when the MEMS apparatus is packaged in a dual inline package (DIP)

As shown in FIG. 7, the MEMS apparatus 1 can hermetically seal the MEMS unit 10 in the extension of the general complementary metal-oxide semiconductor (CMOS) process. Accordingly, when the MEMS apparatus 1 is packaged, it is possible to use an inexpensive mold seal for general purposes. While the MEMS-IC integrated semiconductor substrates are expected to further minimize in future, the MEMS apparatus 1 can use a low-cost package for packaging the MEMS unit 10, while maintaining the stability of the MEMS unit 10. A small outline package (SOP), a ball grid array (BGA), a ceramic package, or the like may be used for the package.

In this manner, with the MEMS apparatus according to a first embodiment, the layer for etching a sacrifice layer provided in the process of manufacturing the MEMS apparatus is used as the cover for the MEMS portion, and the etching holes provided to the layer are sealed with the sealing material shaped in a sphere or a hemisphere. Accordingly, the MEMS apparatus can be hermetically sealed with a little damage, without applying high temperature and high voltage. Because the MEMS portion that drives mechanically and the integrated circuit that controls the MEMS portion can be formed on the same substrate, it is possible to manufacture at a low cost.

With the MEMS apparatus according to the first embodiment, the MEMS apparatus can be hermetically sealed without applying high temperature and high voltage. Because the MEMS portion that drives mechanically and the integrated circuit that controls the MEMS portion can be formed on the same substrate, it is possible to minimize the size.

Moreover, with the MEMS apparatus according to the first embodiment, because a special cap material is not required for hermetically sealing the MEMS apparatus, it is possible to manufacture at a low cost.

A second embodiment will now be explained with reference to the accompanying drawings. In the first embodiment, the elements or the particles in a sphere or a hemisphere are used as the sealing material. In the second embodiment, a substrate uniformly formed with the elements in a sphere or a hemisphere is used as the sealing material. With a configuration of the MEMS apparatus according to the present embodiment, portions different from the first embodiment will be explained. Because the other portions are the same as those in the first embodiment, the portions denoted by the same reference numerals should be referred to the above explanations, and the explanations thereof will be omitted.

As shown in FIG. 8, a MEMS apparatus 31 mainly includes the buried oxide film (BOX) layer 3, the single crystal semiconductor layer 4, the interlayer insulating films 5, the cover 6, a sealing substrate 32, and the coat 7 sequentially on the substrate 2. The SOI substrate 8 is made by depositing the single crystal semiconductor layer 4 on the substrate 2 interposing therebetween the buried oxide film (BOX) layer 3.

The MEMS apparatus 31 can be functionally divided into the control circuit unit 9 and the MEMS unit 10. The control circuit unit 9 includes the SOI substrate 8, the interlayer insulating films 5, the electrode 11 and the thin film wiring 12 made of aluminum, the polysilicon 13, and the like. The cavity 14 is formed at the upper part of the MEMS unit 10, and the cavity 15 is formed at the lower part of the MEMS unit 10. The pores 16 are formed on the cover 6 in a lattice pattern.

The sealing substrate 32 is a substrate that a plurality of elements 33 in a sphere or a hemisphere is collectively formed on the surface. Silicon, a glass, or a hot-melt resin such as epoxy and polyimide may be used as a material for the sealing substrate 32. A cured photoresist shaped in a sphere or a hemisphere may also be used on the silicon or the glass substrate. The sealing substrate 32 is placed on the portion where the pores 16 are formed of the cover 6. The elements 33, which are the portions shaped in a sphere or a hemisphere of the sealing substrate 32, are filled into all the pores 16 formed on the cover 6, thereby hermetically sealing the MEMS unit 10 (cavity 14) from the outside.

As shown in FIG. 9, in the present embodiment, the elements 33 shaped in a hemisphere are formed on the sealing substrate 32 in a lattice pattern. The elements 33 are arranged the same as the pores 16 formed on the cover 6, and are the same number as the pores 16. The size of the element 33 is larger than that of the pore 16. For example, if the diameter of the pore 16 is approximately 9 micrometers, the diameter of the element 33 is made approximately 10 micrometers, that is approximately 10% larger than that of the pore 16. By setting the size in this manner, the element 33 can completely cover the pore 16.

The following methods may be used to form the elements 33 shaped in a sphere or a hemisphere on the same substrate.

(1) Pattern a plurality of photoresist patterns of approximately 1 to 10 micrometers diameter arranged at a desired pitch on the single crystal silicon substrate, by using a lithography technique for general purposes. Then, by isotropically etching the substrate using gas such as sulfur hexafluoride ($SF_6$), the elements 33 shaped in a sphere or a hemisphere are formed on the single crystal silicon substrate.

(2) Pattern the photoresist patterns of approximately 1 to 10 micrometers diameter arranged at a desired pitch on the glass substrate, by using the lithography technique for general purposes. Then, by isotropically etching the substrate using gas such as carbon tetrafluoride ($CF_4$), the elements 33 shaped in a sphere or a hemisphere are formed on the glass substrate.

(3) Fill the hot-melt resin such as epoxy and polyimide into a mold, for example, formed by Cu that has concaves in a sphere or a hemisphere of approximately 1 to 10 micrometers diameter. Then, after the resin is cured, take out from the mold, and a resin substrate formed with the elements 33 shaped in a sphere or a hemisphere is completed.

(4) Pattern the photoresist patterns of approximately 1 to 10 micrometers diameter arranged at a desired pitch on the silicon or the glass substrate, by using the lithography technique for general purposes. By placing the substrate in an atmosphere of approximately 100 to 300 degrees centigrade, and dissolving (reflowing) the photoresist patterns, the photoresist patterns shaped in a sphere or a hemisphere that have an arc-shape on the surface can be formed. Then, when the temperature of the substrate is lowered, the photoresist patterns shaped in a sphere or a hemisphere cure, thereby forming the elements 33. The dissolving temperature at this time is defined by the specification of the photoresist. The shape of the sphere or the hemisphere obtained by dissolving the photoresist is determined by the photoresist pattern, the dissolving temperature, the dissolving time, and the dissolving atmosphere.

Referring back to FIG. 8, the coat 7 is deposited on the upper surface of the cover 6 (sealing substrate 32), and adheres (joins) the cover 6 and the sealing substrate 32. The coat 7 may only be provided on a portion where the sealing substrate 32 is placed, instead of the entire cover 6.

Figure 10:
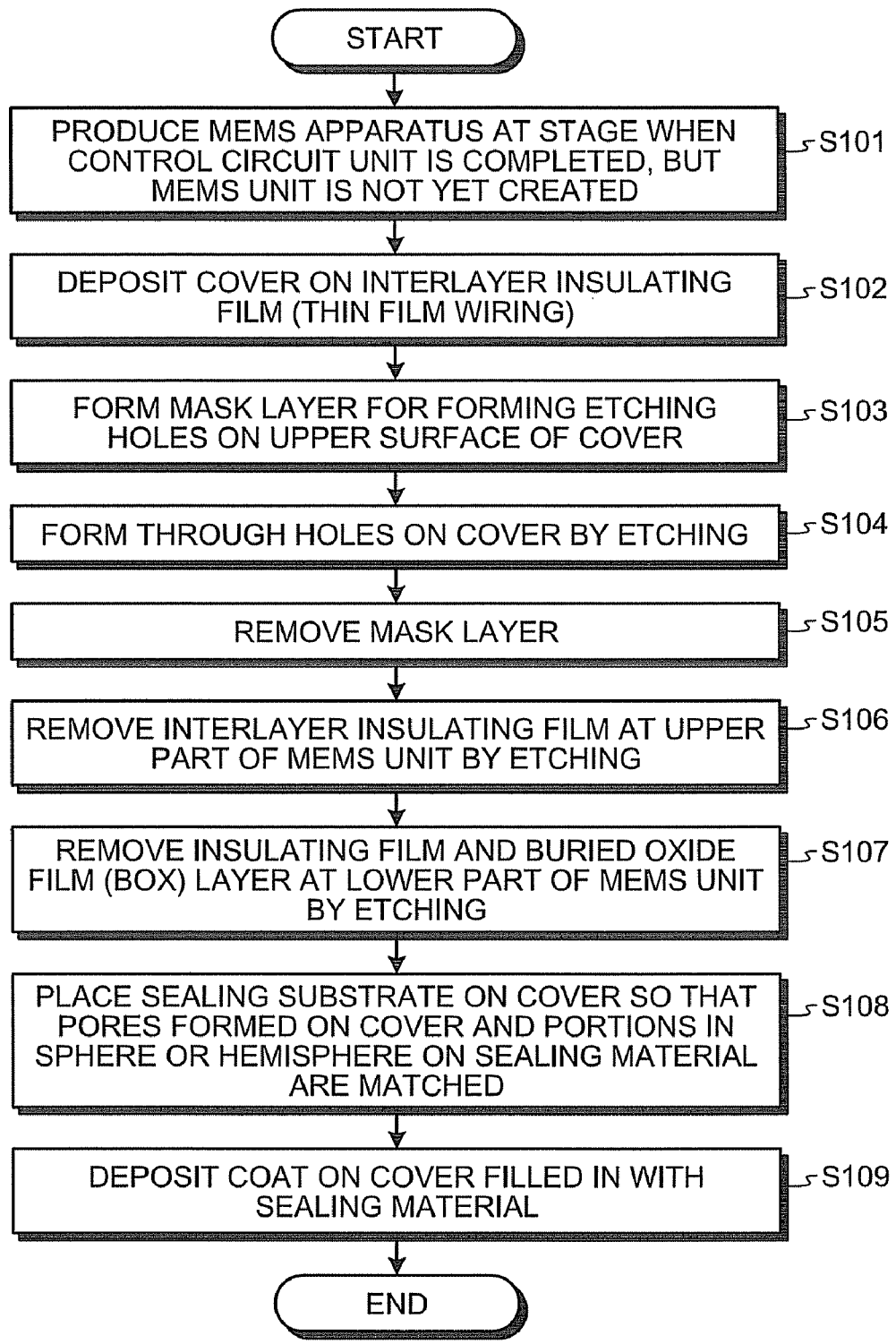
FIG. 10 is a flowchart showing a manufacturing process of the MEMS apparatus according to the second embodiment.
Figure 11A:
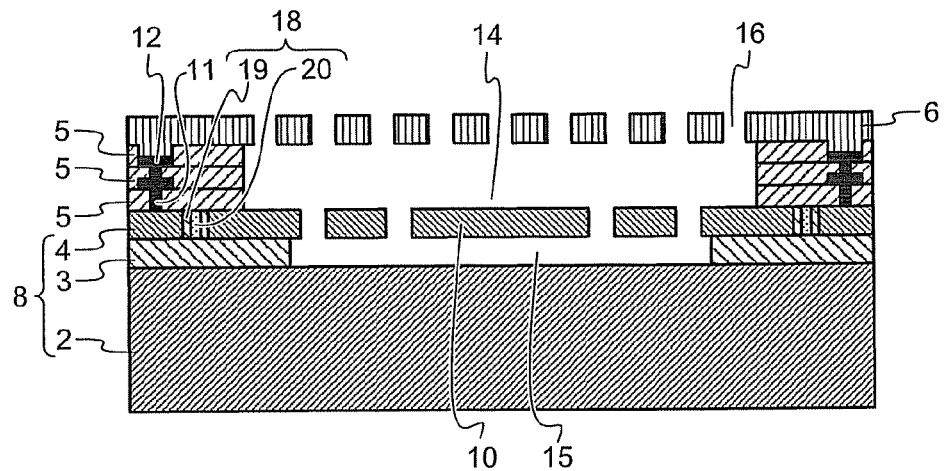
FIG. 11A is a process sectional view of the MEMS apparatus, after the control circuit unit and the MEMS unit are completed.
Figure 11B:
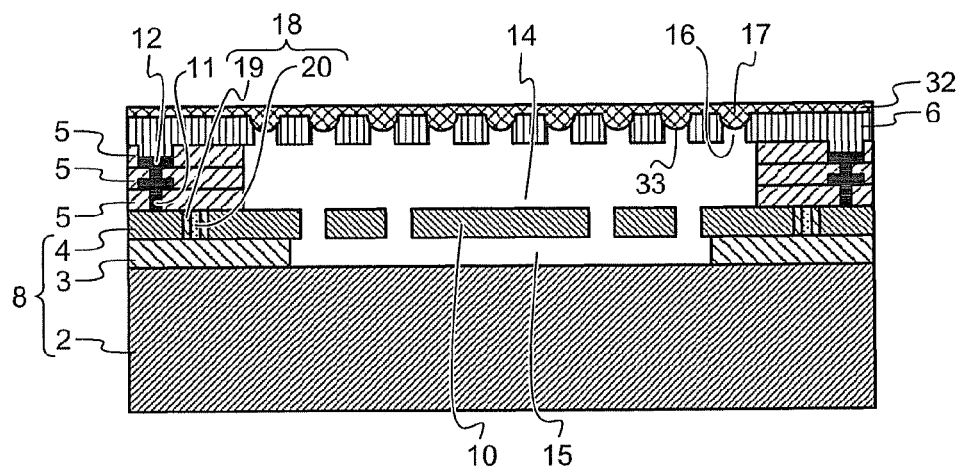
FIG. 11B is a process sectional view of the MEMS apparatus, after the sealing substrate is placed on the cover, so that the pores and portions in a sphere or a hemisphere of the sealing substrate match with one another.
Figure 11C:
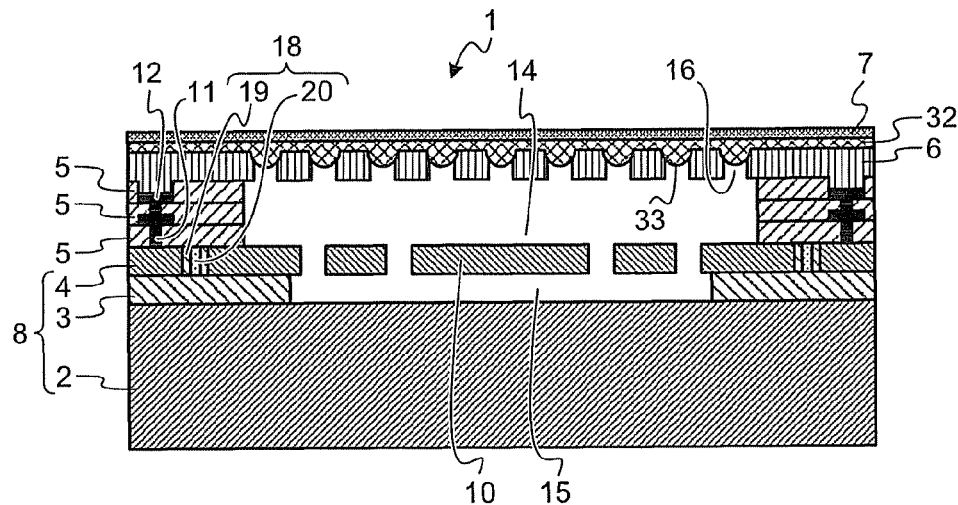
FIG. 11C is a process sectional view of the MEMS apparatus, after the coat is deposited on the cover sealed with the sealing substrate.

A method of manufacturing the MEMS apparatus according to the present embodiment will now be explained with reference to FIG. 10. In FIGS. 11A to 11C, the MEMS unit 10 is formed in the center of the diagrams, and the control circuit unit 9 is formed from the both ends of the diagrams to a portion that is not shown.

As shown in FIG. 11A, the process of removing the insulating film 21 and the buried oxide film (BOX) layer 3 present at the lower part of the MEMS unit 10 by the selective etching, and completing the control circuit unit 9 and the MEMS unit 10 is the same as the method of manufacturing the MEMS apparatus according to the first embodiment. Because the flowcharts at steps S101 to S107 are the same as the flowcharts at steps S51 to S57 in FIG. 5 according to the first embodiment, the detailed description thereof will be omitted.

As shown in FIG. 11B, the sealing substrate 32 is placed on the cover 6, so as the pores 16 formed on the cover 6 match with the portions of the elements 33 of the sealing substrate 32 made in advance (so that the pores 16 and the portions of the elements 33 are fitted into each other) (step S108). More specifically, marks for aligning are prepared in advance on both the SOI substrate 8 that forms the MEMS apparatus 31 and the sealing substrate 32, and by joining the both marks by using an infrared transmission method and the like, after facing the respective substrates, the SOI substrate 8 and the sealing substrate 32 can be aligned correctly.

In the present method, the pores 16 are covered by the elements 33 by placing the sealing substrate 32 on the cover 6. Accordingly, the high alignment accuracy required for the capping method in Adit Decharat et al., Novel Room-Temperature Wafer-to-Wafer Attachment and Sealing of Cavities Using Cold Metal Welding, MEMS2007, pp. 411-414 is not required.

Finally, as shown in FIG. 11C, by depositing the coat 7 on the cover 6 sealed with the sealing substrate 32 using the CVD and the sputtering, the cover 6 and the sealing substrate 32 are adhered (joined) (step S109). With the present process, the cover 6 and the sealing substrate 32 are fixed, and even if there is a minute gap between the cover 6 and the sealing substrate 32, the gap will be filled in. The MEMS apparatus 31 is completed through the processes from the steps S101 to S109. If needed, an opening for the I/O pad (not shown) may be opened at any position, on the surface of the substrate 2 where the MEMS apparatus 31 is formed.

In this manner, with the MEMS apparatus according to the second embodiment, the sealing substrate of which the elements shaped in a sphere or a hemisphere are collectively formed on the surface, is used as the sealing material for the pores formed on the cover, thereby enabling to seal the pores by the elements all at once. As a result, the problem that the elements will not be filled into the pores does not occur, thereby enabling to enhance the reliability of hermetic sealing of the MEMS unit.

A third embodiment will now be explained with reference to the accompanying drawings. In the third embodiment, a method of inspecting whether all the pores formed on the cover are filled in with the sealing material, in the MEMS apparatus according to the first embodiment will be explained. Because the configuration of the MEMS apparatus according to the present embodiment is the same as the first embodiment, the portions denoted by the same reference numerals should be referred to the above explanations, and the explanations thereof will be omitted.

With the MEMS apparatus 1 according to the first embodiment, the requirement for hermetically sealing the MEMS unit 10 (cavity 14) from the outside is to fill the sealing material 17 into all the pores 16 formed on the cover 6. If the sealing material 17 is not filled into the pores 16 by some reason, and if nothing is done, various problems may occur to the MEMS apparatus 1 (MEMS unit 10), in the subsequent process of depositing the coat 7. Therefore, when the filling process of the sealing material 17 is finished, it is necessary to confirm whether the sealing material 17 is filled into all the pores 16 formed on the cover 6.

Figure 12A:
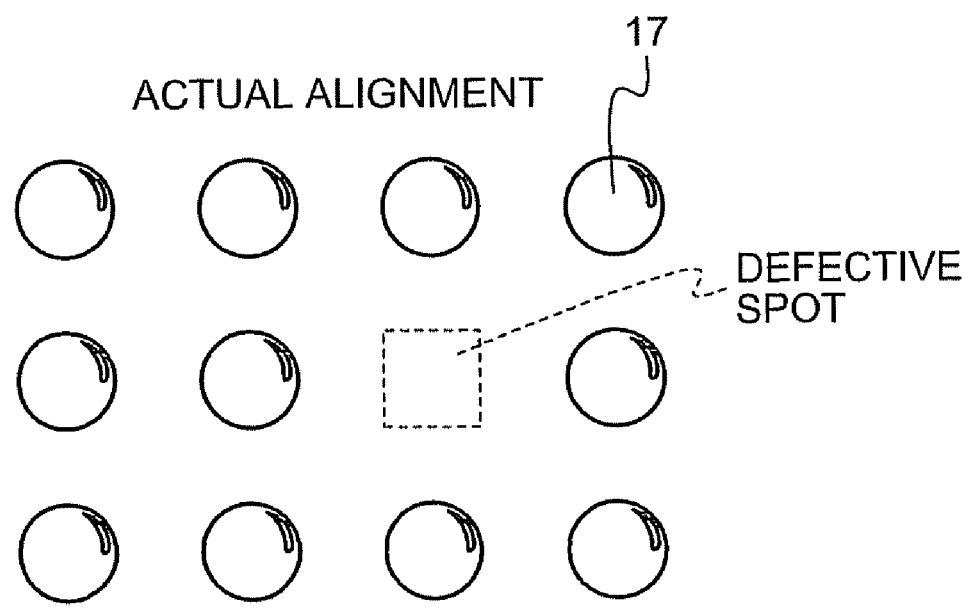
FIGS. 12A and 12B are exemplary diagrams of a method for inspecting whether the sealing material is filled into all the pores formed on the cover.
Figure 12B:
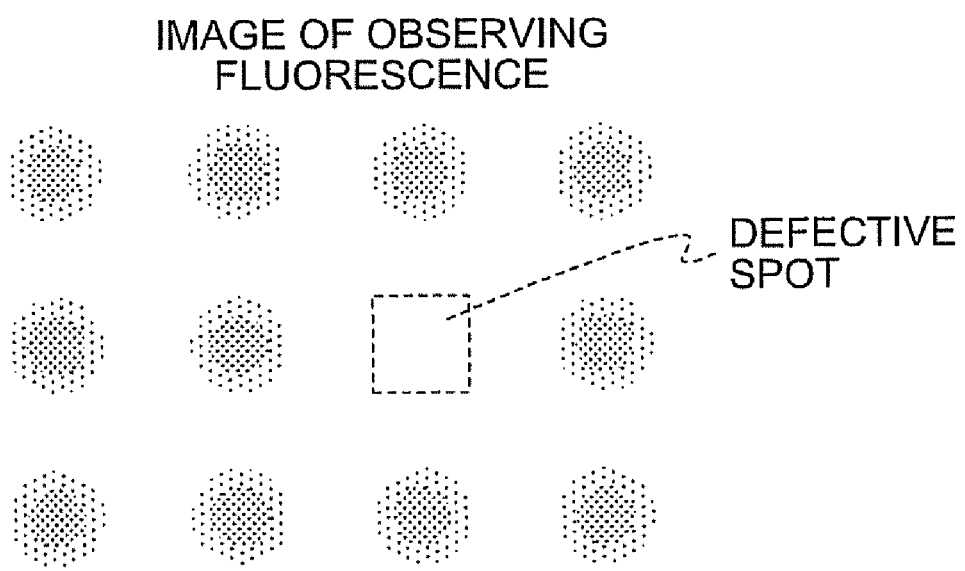

An example of inspecting whether the sealing material is filled into all the pores formed on the cover will now be explained with reference to FIGS. 12A and 12B. In the present example, a fluorescent emitter is used as a material for the sealing material 17, to confirm whether the portion where the sealing material should be filled in fluoresces. The fluorescent emitter is a substance that has fluorescent emission characteristics when light is illuminated, and a silica particle is known in general.

The inspection will be carried out as follows. After finishing the filling process of the sealing material 17, the spots where the sealing material 17 is filled of the cover 6 are observed by a fluorescent microscope. The spots where the sealing material 17 is filled produce fluorescence, but the spots where the sealing material 17 is not filled do not produce fluorescence and remain dark. FIG. 12A depicts the sealing material 17 actually filled into the pores 16, and the sealing material 17 is not filled into a defective spot. FIG. 12B depicts an image of observing the portion shown in FIG. 12A by the fluorescent microscope, and the defective spot where the fluorescence is not produced can be recognized at a glance. Therefore, by collectively treating the image observed by the fluorescent microscope, it is possible to confirm whether the sealing material 17 is filled into all the pores 16 formed on the cover 6.

Another example of the method to inspect whether the sealing material is filled into all the pores formed on the cover will now be explained with reference to FIGS. 13A and 13B. In the present example, a conductor is used as a material for the sealing material 17, and whether the sealing material 17 is filled will be confirmed by using a phenomenon that the adjacent sealing materials 17 capacitively couple.

The inspection will be carried out as follows: A row is predetermined from the spots where the sealing material 17 is filled in, and after the filling process of the sealing material 17 is finished, a direct-current voltage or an alternating-current voltage is applied to an end of the row, for example, by using a probe, and detects a signal generated from the other end of the row. Because the adjacent sealing materials 17 are capacitively coupled to each other, the signal of a certain level will be detected. If there is a spot in the row where the sealing material 17 is not actually filled in, the distance between the adjacent sealing materials 17 is increased at the spot. Accordingly, the capacitive coupling between the sealing materials is decreased, and the signal level at the spot lowers. By performing the inspection at all the predetermined element rows, it is possible to confirm whether the sealing material 17 is filled into all the pores 16 formed on the cover 6.

Figure 13A:
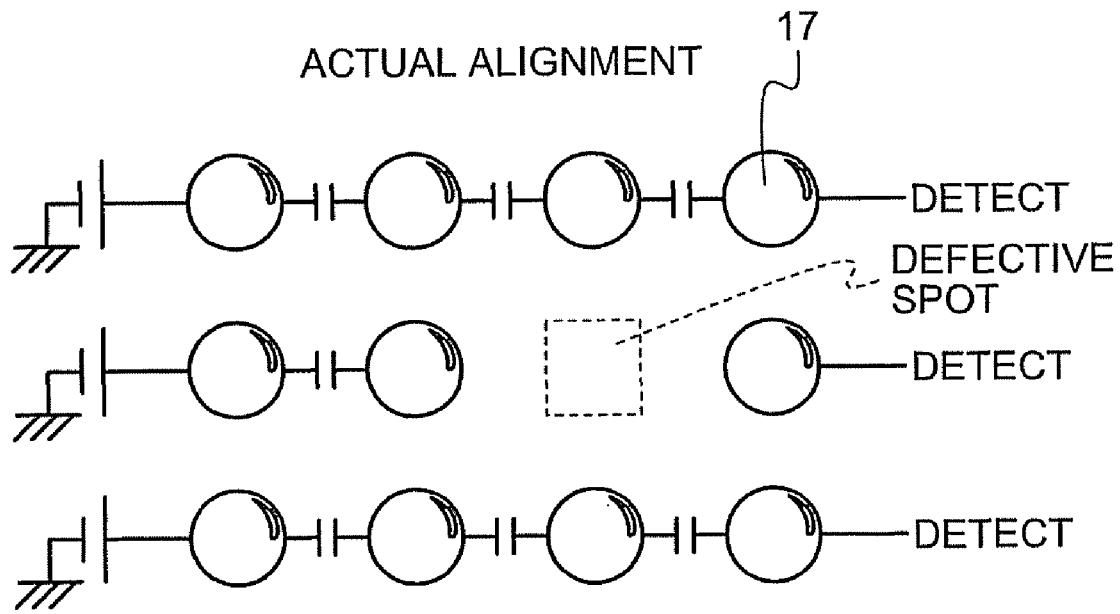
FIGS. 13A and 13B are other exemplary diagrams of a method for inspecting whether the sealing material is filled into all the pores formed on the cover.
Figure 13B:
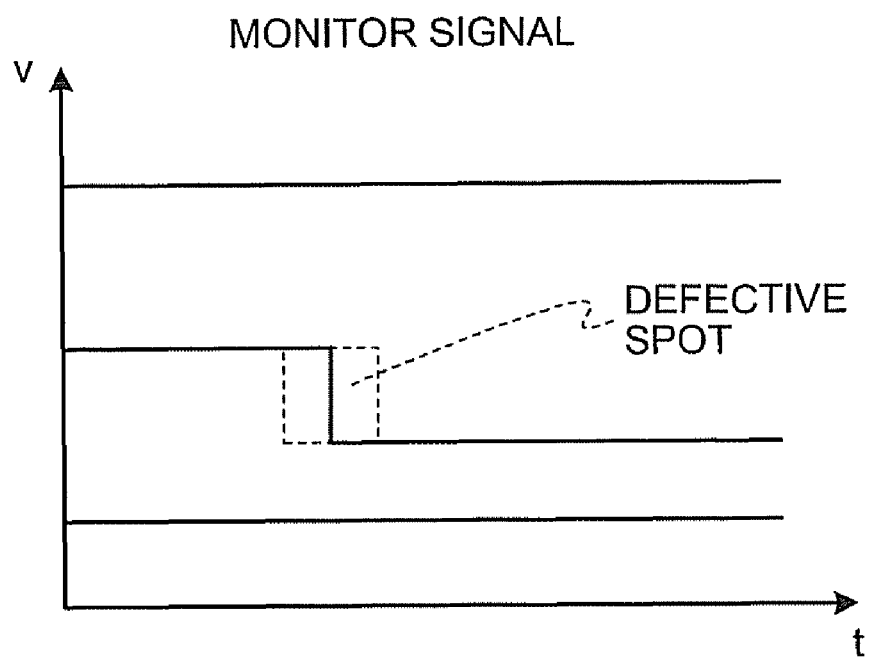

FIG. 13A is an exemplary diagram of the sealing material 17 actually filled into the pores 16, and the sealing material 17 is not filled into a defective spot. FIG. 13B is an exemplary diagram of a monitor signal when the portion in FIG. 13A is applied with the direct-current voltage per row, and the defective spot can be recognized at a glance. Therefore, by collectively treating the monitor signal, it is possible to confirm whether the sealing material 17 is filled into all the pores 16 formed on the cover 6.

As a result of these inspections, when the spots where the sealing material 17 is not filled into the pores 16 formed on the cover 6 are found, it is possible to fill the spots by inducing the sealing material 17 to the spot by electrostatic attractive force and the like.

In this manner, with the inspection method of the MEMS apparatus according to the third embodiment, because the fluorescent emitter is used as the material for the sealing material 17, it is possible to inspect whether the sealing material is filled into all the pores formed on the cover by external observation.

Moreover, with the inspection method of the MEMS apparatus according to the third embodiment, because the conductor is used as the material for the sealing material 17, it is possible to electrically inspect whether the sealing material is filled into all the pores formed on the cover.

The present invention offers an advantage of reducing the cost of the MEMS apparatus.

The present invention offers an advantage of minimizing the size of the MEMS apparatus.

The present invention also offers an advantage of enhancing reliability of the hermetical sealing of the MEMS apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MEMS apparatus comprising:
   a MEMS unit formed on a semiconductor substrate;
   a cover provided with a pore and serving to seal the MEMS unit, wherein the pore is sealed with a sealing material shaped in a sphere or a hemisphere; and
   a coat that is deposited on the cover and the sealing material and joins the cover and the sealing material on the cover.

2. The apparatus according to claim 1, wherein a dimension of the shape of the sphere or the hemisphere of the sealing material is larger than the dimension of the shape of the pore.

3. The apparatus according to claim 1, further comprising a hollow portion between the MEMS unit and the cover.

4. A MEMS apparatus comprising:
   a MEMS unit formed on a semiconductor substrate;
   a cover provided with a pore and serving to seal the MEMS unit, wherein the pore is sealed with a sealing material that is a substrate having a sphere or a hemisphere shaped portion on a surface of the substrate; and
   a coat that is deposited on the cover and the sealing material and joins the cover and the sealing material on the cover.

5. The apparatus according to claim 4, wherein a dimension of the shape of the sphere or the hemisphere of the sealing material is larger than the dimension of the shape of the pore.

6. The apparatus according to claim 4, further comprising a coat that joins the cover and the sealing material on the cover.

7. The apparatus according to claim 4, further comprising a hollow portion between the MEMS unit and the cover.

8. A method of manufacturing a MEMS apparatus, in a semiconductor substrate having a MEMS unit formed thereon, with an upper part of the MEMS unit being covered by a film with a pore, and a hollow portion being formed between the MEMS unit and the film, the method comprising:
   filling a sealing material shaped in a sphere or a hemisphere in the pore; and
   depositing a coat that covers the film and the sealing material.

9. A method of manufacturing a MEMS apparatus, in a semiconductor substrate having a MEMS unit formed thereon, with an upper part of the MEMS unit being covered by a film with a pore, and a hollow portion being formed between the MEMS unit and the film, the method comprising:
   filling in the pore a sphere or a hemisphere shaped portion formed on a surface of a sealing material that is a substrate; and
   depositing a coat that covers the film and the sealing material.

* * * * *